United States Patent
Shroff et al.

(10) Patent No.: US 9,263,441 B2
(45) Date of Patent: Feb. 16, 2016

(54) IMPLANT FOR PERFORMANCE ENHANCEMENT OF SELECTED TRANSISTORS IN AN INTEGRATED CIRCUIT

(71) Applicant: FREESCALE SEMICONDUCTOR, INC., Austin, TX (US)

(72) Inventors: Mehul D. Shroff, Austin, TX (US); William F. Johnstone, Austin, TX (US); Chad E. Weintraub, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/244,330

(22) Filed: Apr. 3, 2014

(65) Prior Publication Data

US 2014/0210016 A1    Jul. 31, 2014

Related U.S. Application Data

(62) Division of application No. 13/213,992, filed on Aug. 19, 2011, now Pat. No. 8,709,883.

(51) Int. Cl.
  *H01L 27/088* (2006.01)
  *H01L 21/8234* (2006.01)
  *H01L 27/02* (2006.01)

(52) U.S. Cl.
  CPC ...... *H01L 27/088* (2013.01); *H01L 21/823412* (2013.01); *H01L 21/823493* (2013.01); *H01L 27/0207* (2013.01)

(58) Field of Classification Search
  CPC .............. H01L 21/823412; H01L 21/823493; H01L 27/088; H01L 27/0207
  See application file for complete search history.

(56) References Cited

U.S. PATENT DOCUMENTS

| | | | |
|---|---|---|---|
| 5,254,487 A | 10/1993 | Tamagawa | |
| 5,336,624 A | 8/1994 | Walden | |
| 5,580,805 A | 12/1996 | Kuroda | |
| 6,670,990 B1 | 12/2003 | Kochi et al. | |
| 7,858,500 B2 | 12/2010 | Cartier et al. | |
| 7,915,667 B2 | 3/2011 | Knoefler et al. | |
| 8,237,219 B2 | 8/2012 | Usujima et al. | |
| 8,484,597 B2 * | 7/2013 | Arimoto | 716/113 |
| 2002/0151134 A1 * | 10/2002 | Kunikiyo | 438/254 |
| 2003/0052389 A1 | 3/2003 | Maeda et al. | |
| 2004/0245433 A1 | 12/2004 | Koyama | |
| 2008/0012080 A1 | 1/2008 | Yaegashi | |
| 2010/0210083 A1 * | 8/2010 | Fukuda et al. | 438/285 |
| 2011/0101462 A1 * | 5/2011 | Torii | 257/368 |
| 2011/0215422 A1 | 9/2011 | Curello et al. | |
| 2012/0025318 A1 * | 2/2012 | Richter et al. | 257/368 |
| 2012/0258592 A1 | 10/2012 | Chen et al. | |

\* cited by examiner

*Primary Examiner* — Latanya N Crawford

(57) ABSTRACT

A first implant is performed into a substrate to form a well in which a plurality of transistors will be formed. Each transistor of a first subset of the plurality of transistors to be formed has a width that satisfies a predetermined width constraint and each transistor of a second subset has a width that does not satisfy the constraint. A second implant is performed at locations in the well in which transistors of the first subset will be formed and not at locations in the well in which transistors of the second subset will be formed. The transistors are formed, wherein a channel region of each transistor of the first subset is formed in a portion of the substrate which received the second implant and a channel region of each transistor of the second subset is formed in a portion of the substrate which did not receive the second implant.

15 Claims, 3 Drawing Sheets

US 9,263,441 B2

IMPLANT FOR PERFORMANCE ENHANCEMENT OF SELECTED TRANSISTORS IN AN INTEGRATED CIRCUIT

RELATED APPLICATION

This application is a Divisional of co-pending, U.S. patent application Ser. No. 13/213,992, filed on Aug. 19, 2011, and having common inventor(s) and a common assignee.

BACKGROUND

1. Field

This disclosure relates generally to integrated circuits, and more specifically, to enhanced performance of selected transistors of the integrated circuit by use of an implant.

2. Related Art

Integrated circuits are designed with an expectation of transistor characteristics based on experiments with regard to the anticipated process and modeling of the transistor performance. Sometimes the models are not completely accurate so that the integrated circuit may not perform precisely as predicted or further performance changes may be found to be desirable after having been field tested. This may result in the need for replacing one or more of the masks in the mask set to correct the identified issue because at least some portion of the initial mask set will be unusable.

Accordingly, there is a need to provide a technique that allows for changing transistor characteristics to more desired characteristics without requiring replacement of all or some portion of the mask set.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A semiconductor device has a plurality of transistors of a first conductivity type in a well that has a background doping. Transistors within that well that have a channel width less than predetermined dimension are doped to reduce the threshold voltage and increase the drive current of those transistors. Although this may have the effect of increasing leakage of those implanted transistors, the overall leakage is only increased by a small amount because these are the smallest transistors and the number of transistors receiving this implant can be a relatively small number of the total number of transistors. This can be used to improve the performance of an existing design that may already be in production. This is better understood by reference to the drawings and the following description.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
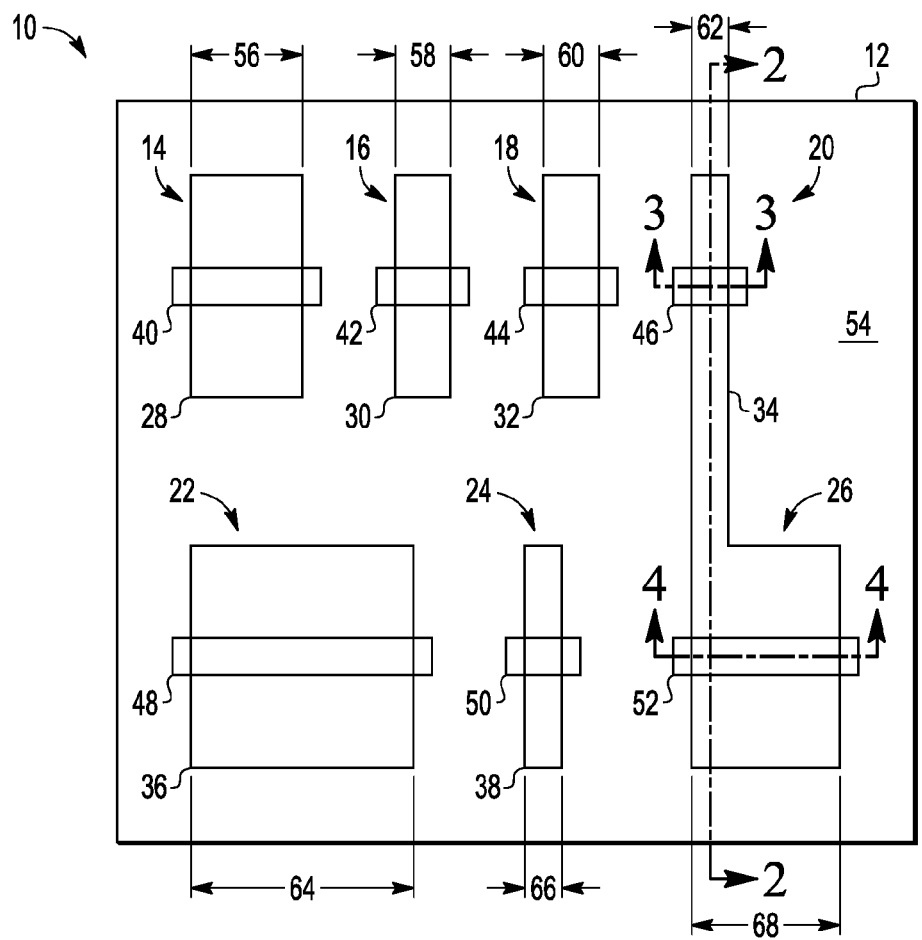
FIG. 1 is a top view of a semiconductor device according to an embodiment.

Shown in FIG. 1 is a semiconductor device 10 having a well 12 in a semiconductor substrate in which transistors 14, 16, 18, 20, 22, 24, and 26 are formed. Transistor 14 is formed in an active region 28 and has a gate 40 across active region 28. Transistor 16 is formed in an active region 30 and has a gate 42 across active region 30. Transistor 18 is formed in an active region 32 and has a gate 44 across active region 32. Transistor 20 is formed in an active region 34 and has a gate 46 across active region 34. Transistor 22 is formed in an active region 36 and has a gate 48 across active region 36. Transistor 24 is formed in an active region 38 and has a gate 50 across active region 38. Transistor 26 is formed in active region 34 and has a gate 52 across active region 34. Transistors 20 and 26 share the same active region, active region 34. Transistors 14, 16, 18, 20, 22, 24, and 26 have channel widths 56, 58, 60, 62, 64, 66, and 68, respectively, that vary in magnitude. Channel widths 66 and 62 are the smallest channel widths shown in FIG. 1. Active regions 28, 30, 32, 34, 36, and 38 are surrounded by isolation region 54. Transistors 14, 16, 18, 20, 22, 24, and 26 are MOS transistors and in this example the type of MOS transistor is P type and may thus be called P channel transistors.

Figure 2:
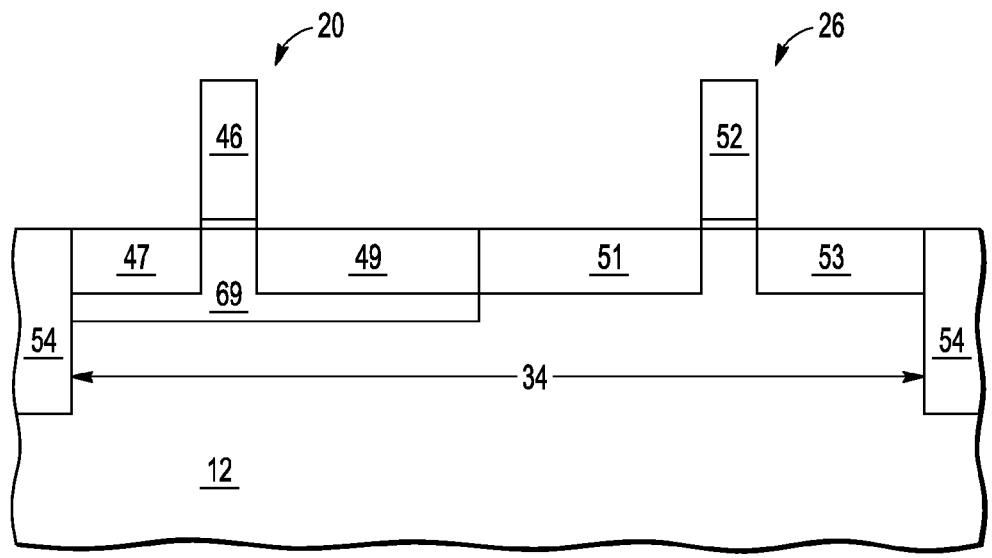
FIG. 2 is a cross section of a first portion of an active region of the semiconductor device.

Shown in FIG. 2 is a cross section 2-2 of semiconductor device 10 as shown in FIG. 1 through transistors 20 and 26 showing active region 34 in well 12, gates 46 and 52, a source/drain 47 of transistor 20, a source/drain 49 of transistor 20, a source/drain 51 of transistor 26, a source/drain 53 of transistor 26, and an implant region 69 in active region 34. Implant region 69 is doped to a level so that it has a threshold voltage which has a lower absolute value than that of transistor 26.

Figure 3:
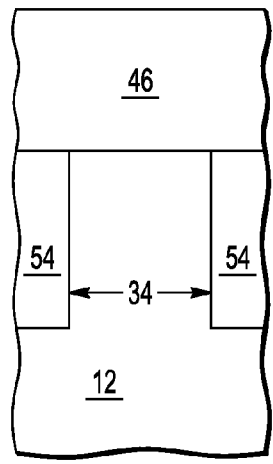
FIG. 3 is a cross section of a second portion of the active region.

Shown in FIG. 3 is a cross section 3-3 of semiconductor device 10 as shown in FIG. 1 through transistor 20 showing active region 34 bounded by isolation region 54. Active region 34 as shown in FIG. 3 shows a channel width of transistor 20. Gate 46 extends across active region 34 in cross section 3-3 and over isolation region 54.

Figure 4:
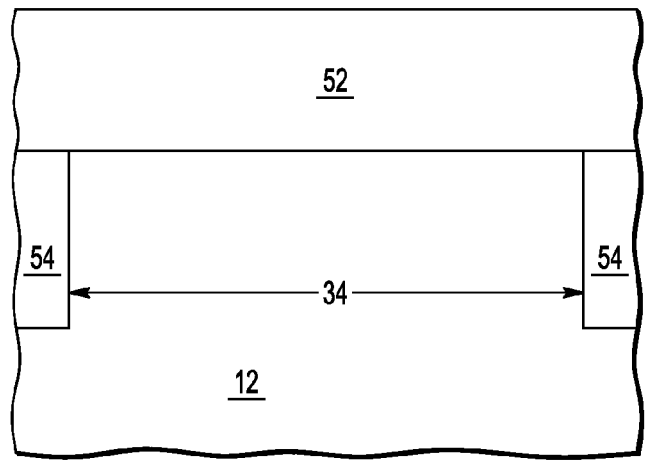
FIG. 4 is a cross section of a third portion of the active region.

Shown in FIG. 4 is a cross section 4-4 of semiconductor device 10 as shown in FIG. 10 through transistor 26 showing active region 34 bounded by isolation region 54. Active region 34 shown in FIG. 4 shows a channel width of transistor 26 being greater than the channel width of transistor 20. Gate 52 extends across active region 34 and over isolation region 54.

Transistor 24 has the same channel width as transistor 20 and is otherwise also substantially the same as transistor 20 but is formed in its own active region, active region 38. All of the other transistors, transistors 14, 16, 18, 22, and 26, have a greater channel width than transistors 20 and 24. Transistors 14, 16, 18, 22, and 26 may be considered a first set of transistors and transistors 20 and 24 a second set of transistors in which the first and second sets are mutually exclusive. Each transistor of the first set has a channel width greater than some predetermined amount. Similarly each transistor of the second set has a channel width not greater than the predetermined amount. The predetermined amount is chosen based on some desired performance result. The inventors have found that the current drive for a given gate voltage can be increased for the second set of transistors by performing a counterdoping implant while causing a relatively small increase in source/drain leakage because the transistors in the second set are relatively small in channel width. Thus, the transistors that receive a large benefit from the counterdoping implant provide a small detriment arising from the counterdoping implant. The effect of the counterdoping implant is to reduce the absolute value of the threshold voltage which results in increasing current drive for a given gate voltage, especially when the transistors are operated in saturation which is typical of digital applications. The threshold voltage of P channel transistors is often stated as negative number due to the source voltage being greater than the gate voltage for normal operation thus the gate to source voltage is considered negative and becomes more negative as conductivity of the transistor is increased. Thus, it is the absolute value of the threshold voltage that is reduced, becoming less negative or at or near zero, by the counterdoping. A further benefit is that the counterdoping implant can be chosen to be performed or not for a particular integrated circuit design after the layout has already been determined and even after devices have been built and sold. Thus, the performance can be enhanced after the design has actually been tested as an actual integrated circuit. The only change to the mask set is to add an implant mask for the counterdoping implant.

Figure 5:
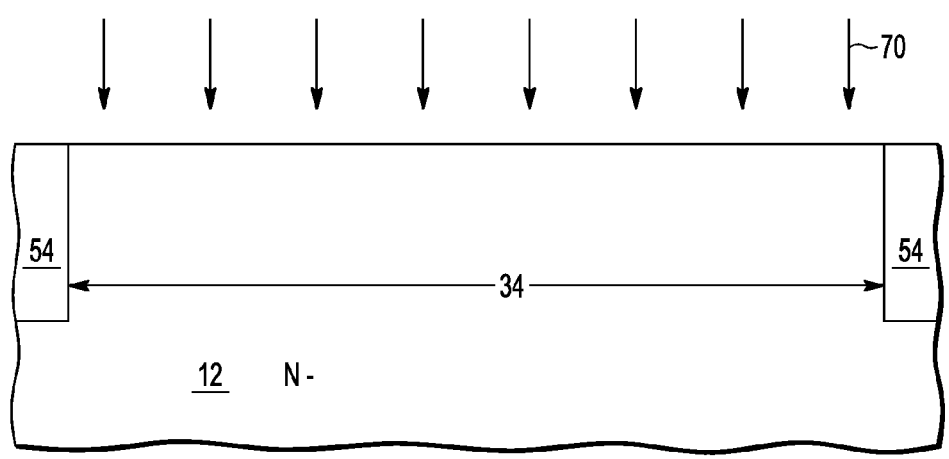
FIG. 5 is a cross section of the semiconductor device at a stage in processing.

Shown in FIG. 5 is a cross section of semiconductor device 10 similar to that of cross section 2-2 taken at an earlier stage in processing showing an implant 70 that forms a background doping to active region 34. Implant 70 is an N-type implant that is applied to all the active regions, active regions 28, 30, 32, 34, 36, and 38 of well 12. Isolation region 54 may be formed before implant 70 as shown in FIG. 5 or after implant 70. Implant 70 may be several implants of varying depths and doses. Implant 70 is an implant that is applied to all of the active regions of the well. Whether the implant reaches all of the well or is partially blocked by isolation, a well implant is one that is applied to all of the active regions of a defined area and affects the threshold voltage of transistors formed in those active regions. The transistors to be formed in the defined area are of the same conductivity type. The doping concentration of the active regions may be considered N−. This doping concentration of N− may itself be a type of counterdoping because prior to implant 70, the active regions in well 12 may be doped to P-type. Thus implant 70 may switch the conductivity type from P to N.

Figure 6:
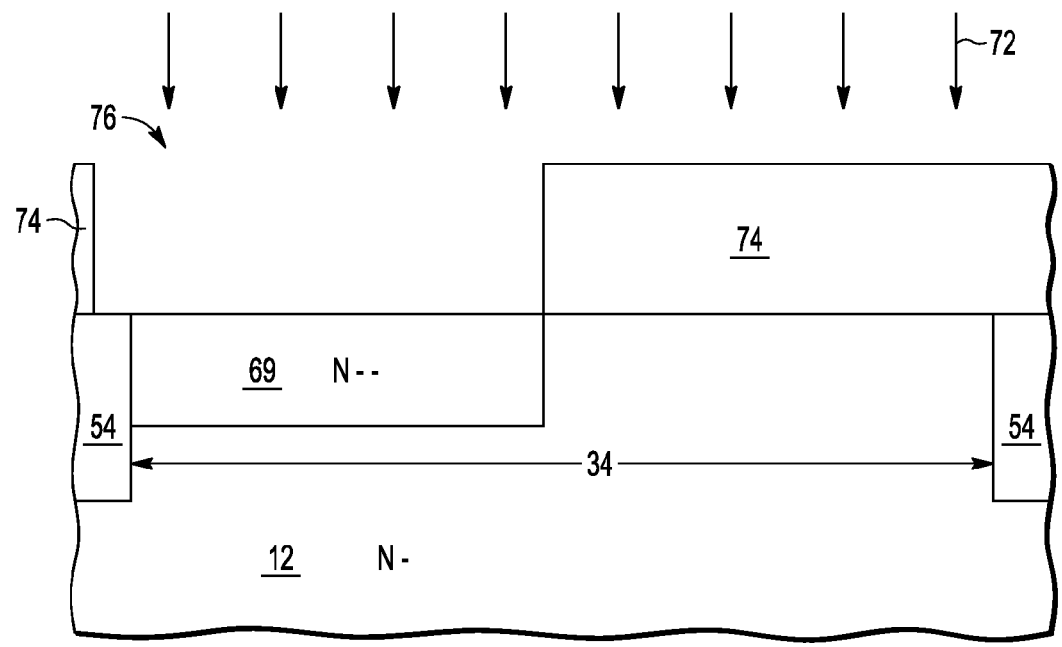
FIG. 6 is a cross section of the semiconductor device at a stage in processing subsequent to that shown in FIG. 5.

Shown in FIG. 6 is a cross section of semiconductor device 10 after forming an implant mask 74 and performing an implant 72 to form implant region 69 shown in FIG. 2 which has reduced concentration of N type to a doping concentration of N−. Implant mask 74 also extends to cover active regions 28, 30, 32, and 36. Active region 38 is open and receives implant 72 forming an implant region region analogous to implant region 69 that also has a doping concentration of N−. Implant 72 is considered counterdoping because it is a species, most commonly boron, that causes P type conductivity that is applied to an N-type region. In this case implant 72 reduces the effective N type concentration rather than reversing the doping type to P type. Implant 72 affects the threshold voltage of transistors 20 and 24 and, in particular, reduces the absolute value of the threshold voltage.

Figure 7:
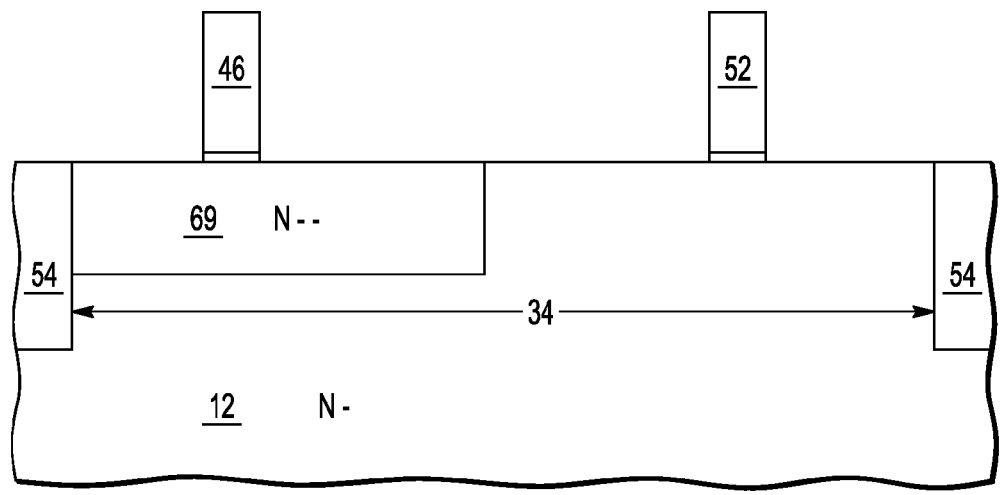
FIG. 7 is a cross section of the semiconductor device at a stage in processing subsequent to that shown in FIG. 6.

Shown in FIG. 7 is a cross section of semiconductor device 10 after forming gate 46 over implant region 69 and gate 52 over active region 34 and spaced from gate 46. Gates 40, 42, 44, 48, and 50 are also formed at this time. After forming the gates, source/drain implants are performed in the active regions of well 12. The result as shown in FIG. 2 is gate 46 over implant region 69, source/drain regions 47 and 49 adjacent to gate 46 and in implant region 69, source/drain regions 51 and 53 adjacent to gate 52 which is above active region 34 and between source/drain regions 51 and 53.

Making a mask to be added to the mask set for forming semiconductor device 10 can be automated even for the case in which the mask set was designed without planning for implant 72 even if there are millions of transistors that are to receive implant 72. It is not unusual for integrated circuits to have over a hundred million transistors and that number continues to increase. So a small percentage would easily be in the millions. The process can be automated by identifying the transistors which have the channel width that needs an implant like implant 72. The channel widths are easily identified and those below a particular predetermined amount can similarly be identified. The needed space for the implant is easily known. The biggest issue is to ensure that the opening in the photoresist is sufficiently large. If the opening as designed is too small it may not open at all or the opening will be inconsistent in size. Sufficient area of the opening is a design rule so the test for sufficiency is already known. The transistors that are too close to other transistors so as to reduce the desired opening are identified. The opening can be expanded in a direction where there is room and reduced in the direction where there is not room. The testing for available space can be automated and then the designed opening increased in an available direction to offset the reduction in another direction. In an example involving millions of transistors needing the implant like implant 72, space was found around each transistor in the first attempt or after altering the border of the opening to avoid implanting where the implant is undesirable. The particular approach will vary based upon the particular equipment available. Automated processes exist for identifying the needed locations, identifying the constraints around the locations, and altering the border of the opening in the photoresist to achieve the needed area of the opening at the locations. If it turns out there are locations where there is simply not sufficient available space for an opening in the photoresist of sufficient area, those locations would not receive the implant and transistors at those locations with insufficient available space would not provide the enhanced performance.

By now it should be appreciated that there has been provided a method for forming a semiconductor structure. The method includes performing a first implant into a semiconductor substrate to form a well in which a plurality of transistors of a same conductivity type will be formed, wherein each transistor of a first subset of the plurality of transistors to be formed has a transistor width that satisfies a predetermined width constraint and each transistor of a second subset of the plurality of transistors to be formed has a transistor width that does not satisfy the predetermined width constraint, and wherein the first subset and the second subset are mutually exclusive. The method further includes performing a second implant into the semiconductor substrate such that the second implant enters the semiconductor substrate at locations in the well in which transistors of the first subset of the plurality of transistors will be formed and does not enter the semiconductor substrate at locations in the well in which transistors of the second subset of the plurality of transistors will be formed. The method further includes forming the plurality of transistors in the well, wherein a channel region of each transistor of the first subset of the plurality of transistors is formed in a portion of the semiconductor substrate which received the second implant and a channel region of each transistor of the second subset of the plurality of transistors is formed in a portion of the semiconductor substrate which did not receive the second implant. The method may have a further characterization by which performing the second implant into the semiconductor substrate comprises implanting a dopant having a conductivity type opposite a conductivity type of a dopant implanted during the first implant. The method may further include prior to performing the second implant, forming a patterned masking layer over the semiconductor substrate, wherein the patterned masking layer exposes locations in the well in which transistors of the first subset of the plurality of transistors will be formed and does not expose locations in the well in which transistors of the second subset of the plurality of transistors will be formed, wherein the step of performing the second implant uses the patterned masking layer to perform the second implant. The method may have a further characterization by which prior to forming the plurality of transistors in the well, the method further comprises removing the patterned masking layer. The method may have a further characterization by which performing the second implant into the semiconductor substrate includes implanting a same dopant as was implanted during the first implant. The method may have a further characterization by which forming the plurality of transistors in the well is further characterized in that the transistors of the first subset of the plurality of transistors has a first threshold voltage and the transistors of the second subset has a second threshold voltage greater than the first threshold voltage. The method may have a further characterization by which forming the plurality of transistors in the well is further characterized in that each transistor of the first subset of the plurality of transistors has a transistor width which satisfies the predetermined width constraint by being less than a predetermined transistor width and each transistor of the second subset of the plurality of transistors has a transistor width which does not satisfy the predetermined width constraint by not being less than the predetermined transistor width. The method may have a further characterization by which forming the plurality of transistors in the well includes forming a gate electrode for each transistor of the plurality of transistors and forming a first source/drain region adjacent a first sidewall of each gate electrode and a second source/drain region adjacent a second sidewall of each gate electrode, wherein the channel region of each transistor of the plurality of transistors is located under the gate electrode of the transistor, between the first and second source/drain regions of each transistor. The method may have a further characterization by which forming the plurality of transistors in the well is further characterized in that a first transistor of the first subset of transistors is immediately adjacent a second transistor of the second subset of transistors, wherein the first transistor and the second transistor share a source/drain region. The method may have a further characterization by which forming the plurality of transistors in the well is further characterized in that a resultant dopant concentration of the channel regions of the transistors of the first subset of the plurality of transistors is less than a resultant dopant concentration of the channel regions of the transistors of the second subset of the plurality of transistors.

Disclosed also is a method for forming a semiconductor structure. The method includes performing a first implant into a semiconductor substrate to form a well in which a plurality of transistors of a same conductivity type will be formed, wherein each transistor of a first subset of the plurality of transistors to be formed has a transistor width less than a predetermined width and each transistor of a second subset of the plurality of transistors to be formed has a transistor width not less than the predetermined width, and wherein the first subset and the second subset are mutually exclusive. The method further includes forming a patterned masking layer over the semiconductor substrate and the well, wherein the patterned masking layer exposes locations of the semiconductor substrate in the well in which transistors of the first subset of the plurality of transistors will be formed and does not expose locations of the semiconductor substrate in the well in which transistors of the second subset of the plurality of transistors will be formed. The method further includes performing a second implant into the semiconductor substrate using the patterned masking layer such that the second implant enters the semiconductor substrate at the locations exposed by the patterned masking layer. The method further includes removing the patterned masking layer. The method further includes forming the plurality of transistors in the well, wherein a channel region of each transistor of the first subset of the plurality of transistors is formed in a portion of the semiconductor substrate which received the second implant and a channel region of each transistor of the second subset of the plurality of transistors is formed in a portion of the semiconductor substrate which did not receive the second implant. The method may have a further characterization by which performing the second implant into the semiconductor substrate comprises. The method may have a further characterization by which implanting a dopant having a conductivity type opposite a conductivity type of a dopant implanted during the first implant. The method may have a further characterization by which performing the second implant into the semiconductor substrate includes implanting a same dopant as was implanted during the first implant. The method may have a further characterization by which forming the plurality of transistors in the well is further characterized in that the transistors of the first subset of the plurality of transistors have a first threshold voltage and the transistors of the second subset have a second threshold voltage greater than the first threshold voltage. The method may have a further characterization by which forming the plurality of transistors in the well includes forming a gate electrode for each transistor of the plurality of transistors and forming a first source/drain region adjacent a first sidewall of each gate electrode and a second source/drain region adjacent a second sidewall of each gate electrode, wherein the channel region of each transistor of the plurality of transistors is located under the gate electrode of the transistor, between the first and second source/drain regions of the transistor. The method may have a further characterization by which forming the plurality of transistors in the well is further characterized in that a first transistor of the first subset of transistors is immediately adjacent a second transistor of the second subset of transistors, wherein the first transistor and the second transistor share a source/drain region. The method may have a further characterization by which forming the plurality of transistors in the well is further characterized in that a resultant dopant concentration of the channel regions of the transistors of the first subset of the plurality of transistors is less than a resultant dopant concentration of the channel regions of the transistors of the second subset of the plurality of transistors.

Also disclosed is a semiconductor structure that includes a well. The semiconductor structure further includes a plurality of transistors formed within the well, wherein each transistor of the plurality of transistors is of a same conductivity type and plurality of transistors includes a first subset of transistors, wherein each transistor in the first subset of transistors has a transistor width that does not satisfy a predetermined width constraint and a second subset of transistors, mutually exclusive with the first subset of transistors, wherein each transistor in the second subset of transistors has a transistor width that satisfies the predetermined width constraint, and wherein each transistor in the second subset of transistors has a channel region which includes an additional dopant as compared to the channel regions of the second subset of transistors. The semiconductor structure may have a further characterization by which the channel region of each transistor of the plurality of transistors has a dopant of a first conductivity type and the additional dopant in each channel regions of the transistors of the second subset of transistors is of a second conductivity type opposite the first conductivity type. The semiconductor structure may have a further characterization by which the transistor width of each transistor in the second subset of transistors is less than a predetermined transistor width and the transistor width of each transistor in the first subset of transistors is not less than a predetermined transistor width.

Although the invention is described herein with reference to specific embodiments, various modifications and changes can be made without departing from the scope of the present invention as set forth in the claims below. For example, rather than counterdoping the small channel width transistors, applying an implant that increases the doping concentration in the channels of the larger channel width transistors can be done. This would have the effect of reducing the leakage of the larger channel width transistors while decreasing their drive current. In other embodiments, NMOS devices may be used or other geometry constraints such as area or length may be used. Constraints used may also involve a range or combination of constraints. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor structure comprising:
    a well; and
    a plurality of transistors formed within the well, wherein:
        each transistor of the plurality of transistors is of a same conductivity type, and
        the plurality of transistors comprises:
            a first subset of transistors, wherein each transistor in the first subset of transistors has a transistor width that does not satisfy a predetermined width constraint; and
            a second subset of transistors, mutually exclusive with the first subset of transistors, wherein each transistor in the second subset of transistors has a transistor width that satisfies the predetermined width constraint, wherein each transistor in the second subset of transistors has a channel region which includes an additional dopant as compared to the channel regions of the first subset of transistors, and wherein the channel region of each transistor of the plurality of transistors has a dopant of a first conductivity type and the additional dopant in the channel region of each transistor of the second subset of transistors is of a second conductivity type opposite the first conductivity type.

2. The semiconductor structure of claim 1, wherein the transistor width of each transistor in the second subset of transistors is less than a predetermined transistor width and the transistor width of each transistor in the first subset of transistors is not less than a predetermined transistor width.

3. The semiconductor structure of claim 1, wherein each transistor of the first subset of the plurality of transistors has a first threshold voltage and each transistor of the second subset has a second threshold voltage greater than the first threshold voltage.

4. The semiconductor structure of claim 1, wherein each transistor of the plurality of transistors has
    a gate electrode,
    a first source/drain region adjacent a first sidewall of the gate electrode, and
    a second source/drain region adjacent a second sidewall of the gate electrode, wherein the channel region of each transistor of the plurality of transistors is located under the gate electrode of each transistor, between the first and second source/drain regions of each transistor.

5. The semiconductor structure of claim 4, wherein a first transistor of the first subset of transistors is immediately adjacent a second transistor of the second subset of transistors, wherein the first transistor and the second transistor share a source/drain region.

6. The semiconductor structure of claim 1, wherein a resultant dopant concentration of the channel regions of the transistors of the first subset of the plurality of transistors is less than a resultant dopant concentration of the channel regions of the transistors of the second subset of the plurality of transistors.

7. A semiconductor structure comprising:
    a well; and
    a plurality of transistors formed within the well, wherein:
        each transistor of the plurality of transistors is of a same conductivity type, and
        the plurality of transistors comprises:
            a first subset of transistors, wherein each transistor in the first subset of transistors has a transistor width not less than a predetermined width; and
            a second subset of transistors, mutually exclusive with the first subset of transistors, wherein each transistor in the second subset of transistors has a transistor width less than the predetermined width, wherein each transistor in the first subset of transistors has a channel region which comprises a first dopant, wherein each transistor in the second subset of transistors has a channel region which comprises a second dopant, wherein each transistor of the first subset of transistors has a first threshold voltage, wherein each transistor of the second subset of transistors has a second threshold voltage, and wherein the first threshold voltage is greater than the second threshold voltage.

8. The semiconductor structure of claim 7, wherein the first dopant is of a first conductivity type and the second dopant is of a second conductivity type opposite the first conductivity type.

9. The semiconductor structure of claim 7, wherein the channel region of each transistor of the plurality of transistors comprises the first dopant.

10. The semiconductor structure of claim 7, wherein the transistor width of each transistor in the second subset of transistors satisfies a predetermined transistor width constraint and the transistor width of each transistor in the first subset of transistors does not satisfy a predetermined transistor width constraint.

11. The semiconductor structure of claim 7, wherein the first dopant is of a first conductivity type and the second dopant is of a same conductivity type.

12. The semiconductor structure of claim 7, wherein each transistor of the plurality of transistors has
a gate electrode,
a first source/drain region adjacent a first sidewall of the gate electrode, and
a second source/drain region adjacent a second sidewall of the gate electrode, wherein the channel region of each transistor of the plurality of transistors is located under the gate electrode of each transistor, between the first and second source/drain regions of each transistor.

13. The semiconductor structure of claim 12, wherein a first transistor of the first subset of transistors is immediately adjacent a second transistor of the second subset of transistors, wherein the first transistor and the second transistor share a source/drain region.

14. The semiconductor structure of claim 7, wherein a resultant dopant concentration of the channel regions of the transistors of the first subset of the plurality of transistors is less than a resultant dopant concentration of the channel regions of the transistors of the second subset of the plurality of transistors.

15. A semiconductor structure comprising:
a well; and
a plurality of transistors formed within the well, wherein:
    each transistor of the plurality of transistors is of a same conductivity type, and
    the plurality of transistors comprises:
        a first subset of transistors, wherein each transistor in the first subset of transistors has a transistor width that does not satisfy a predetermined width constraint; and
        a second subset of transistors, mutually exclusive with the first subset of transistors, wherein each transistor in the second subset of transistors has a transistor width that satisfies the predetermined width constraint, wherein each transistor in the second subset of transistors has a channel region which includes an additional dopant as compared to the channel regions of the first subset of transistors, and wherein the channel region of each transistor of the plurality of transistors has a dopant of a first conductivity type and the additional dopant in each channel region of each transistor of the second subset of transistors is of a same conductivity type.

* * * * *